(12) United States Patent
Hosokawa

(10) Patent No.: US 10,711,358 B2
(45) Date of Patent: Jul. 14, 2020

(54) METHOD OF PRODUCING LOW ALPHA-RAY EMITTING BISMUTH, AND LOW ALPHA-RAY EMITTING BISMUTH

(71) Applicant: JX Nippon Mining & Metals Corporation, Tokyo (JP)

(72) Inventor: Yu Hosokawa, Ibaraki (JP)

(73) Assignee: JX NIPPON MINING & METALS CORPORATION, Tokyo (JP)

(*) Notice: Subject to any disclaimer, the term of this patent is extended or adjusted under 35 U.S.C. 154(b) by 527 days.

(21) Appl. No.: 14/906,697

(22) PCT Filed: Sep. 22, 2014

(86) PCT No.: PCT/JP2014/075025
§ 371 (c)(1),
(2) Date: Jan. 21, 2016

(87) PCT Pub. No.: WO2015/125331
PCT Pub. Date: Aug. 27, 2015

(65) Prior Publication Data
US 2016/0160368 A1 Jun. 9, 2016

(30) Foreign Application Priority Data
Feb. 20, 2014 (JP) ................. 2014-030482

(51) Int. Cl.
*C25C 1/22* (2006.01)
*C22B 30/06* (2006.01)
(Continued)

(52) U.S. Cl.
CPC .............. *C25C 1/22* (2013.01); *B23K 1/0016* (2013.01); *B23K 35/00* (2013.01); *B23K 35/262* (2013.01);
(Continued)

(58) Field of Classification Search
CPC ........... C22B 30/06; C22B 3/42; C22C 12/00; C22C 43/00; C25C 1/22
(Continued)

(56) References Cited

U.S. PATENT DOCUMENTS 5,378,328 A * 1/1995 Baltazar .................. C22B 30/06
205/232
6,126,909 A 10/2000 Rotmensch et al.
(Continued)

FOREIGN PATENT DOCUMENTS

JP S59-064790 A 4/1984
JP S59-064791 A 4/1984
(Continued)

*Primary Examiner* — Colleen P Dunn
*Assistant Examiner* — Jeremy C Jones
(74) *Attorney, Agent, or Firm* — Howson & Howson LLP

(57) ABSTRACT

Provided is low alpha-ray emitting bismuth having an alpha dose of 0.003 cph/cm$^2$ or less. Additionally provided is a method of producing low alpha-ray emitting bismuth, wherein bismuth having an alpha dose of 0.5 cph/cm$^2$ or less is used as a raw material, the raw material bismuth is melted in a nitric acid solution via electrolysis to prepare a bismuth nitrate solution having a bismuth concentration of 5 to 50 g/L and a pH of 0.0 to 0.4, the bismuth nitrate solution is passed through a column filled with ion-exchange resin to eliminate polonium contained in the solution by an ion-exchange resin, and bismuth is recovered by means of electrowinning from the solution that was passed through the ion-exchange resin. Recent semiconductor devices are of high density and high capacity, and therefore are subject to increased risk of soft errors caused by the effects of alpha rays emitted from materials in the vicinity of semiconductor chips. In particular, there is a strong demand for higher purification of solder materials used near semiconductor devices, and there is a demand for low alpha-ray emitting materials. Therefore, the present invention aims to elucidate (Continued)

the phenomenon of alpha ray generation from bismuth, and to provide a low alpha-ray emitting, high-purity bismuth that can be applied to the required materials and a production method thereof, as well as to provide an alloy of low alpha-ray emitting bismuth and tin and a production method thereof.

22 Claims, 2 Drawing Sheets

(51) Int. Cl.
    *C22C 1/00*          (2006.01)
    *C22C 12/00*        (2006.01)
    *C22C 43/00*        (2006.01)
    *B23K 1/00*          (2006.01)
    *B23K 35/00*        (2006.01)
    *C22C 13/02*        (2006.01)
    *C22B 3/42*          (2006.01)
    *H01L 23/00*        (2006.01)
    *C25C 7/00*          (2006.01)
    *B23K 35/26*        (2006.01)
    *H01L 23/556*       (2006.01)
    *H05K 3/34*          (2006.01)
    *B23K 101/42*       (2006.01)

(52) U.S. Cl.
    CPC .............. *B23K 35/264* (2013.01); *C22B 3/42* (2013.01); *C22B 30/06* (2013.01); *C22C 1/00* (2013.01); *C22C 12/00* (2013.01); *C22C 13/02* (2013.01); *C22C 43/00* (2013.01); *C25C 7/00* (2013.01); *H01L 24/13* (2013.01); *B23K 2101/42* (2018.08); *H01L 23/556* (2013.01); *H01L 2224/13113* (2013.01); *H01L 2224/16225* (2013.01); *H01L 2224/16245* (2013.01); *H01L 2924/01205* (2013.01); *H05K 3/3463* (2013.01); *Y02P 10/234* (2015.11)

(58) Field of Classification Search
    USPC .................................. 75/705; 205/563; 423/2
    See application file for complete search history.

(56) References Cited

U.S. PATENT DOCUMENTS

| | | |
|---|---|---|
| 2006/0201279 A1 | 9/2006 | Weiser et al. |
| 2009/0098012 A1 | 4/2009 | Shindo et al. |
| 2010/0258448 A1* | 10/2010 | Whitehead ................ C25C 1/00 |
| | | 205/538 |
| 2012/0298586 A1 | 11/2012 | Grandbois et al. |
| 2013/0028786 A1 | 1/2013 | Kanou |
| 2014/0010705 A1 | 1/2014 | Kanou |
| 2014/0332404 A1 | 11/2014 | Shindo et al. |

FOREIGN PATENT DOCUMENTS

| | | |
|---|---|---|
| JP | H01-283398 A | 11/1989 |
| JP | H02-228487 A | 9/1990 |
| JP | H05-077087 A | 3/1993 |
| JP | H06-182580 A | 7/1994 |
| JP | H08-246200 A | 9/1996 |
| JP | 09-255339 A | 9/1997 |
| JP | H09-260427 A | 10/1997 |
| JP | H10-158754 A | 6/1998 |
| JP | H11-080852 A | 3/1999 |
| JP | H11-330678 A | 11/1999 |
| JP | H11-343590 A | 12/1999 |
| JP | 2000-045087 A | 2/2000 |
| JP | 2002-285371 A | 10/2002 |
| JP | 2009-097072 A | 5/2009 |
| JP | 2013-185214 A | 9/2013 |
| RU | 2436856 C1 | 12/2011 |
| WO | 2014/069357 A1 | 5/2014 |

* cited by examiner

[Fig. 1]
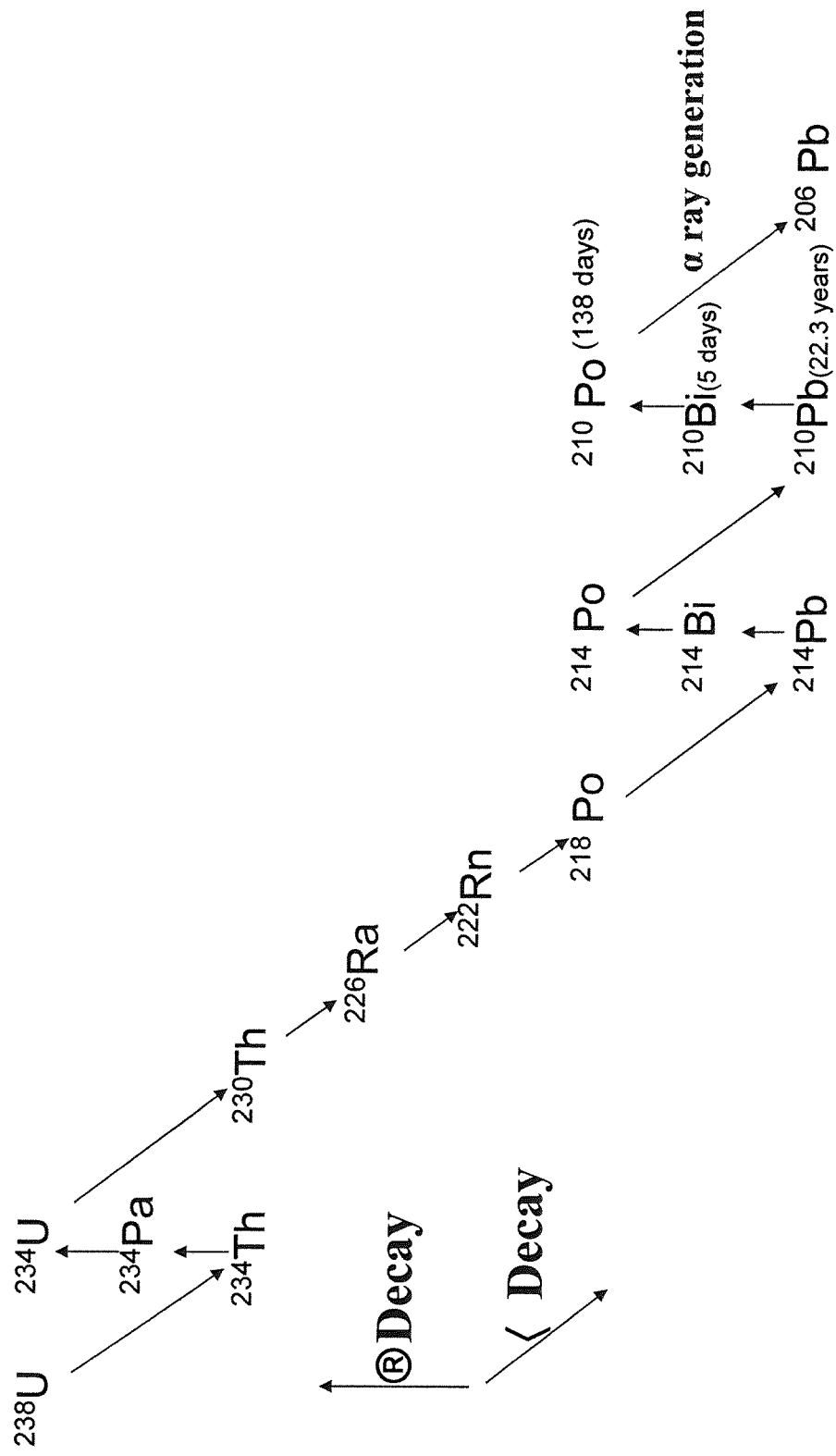

[Fig. 2]
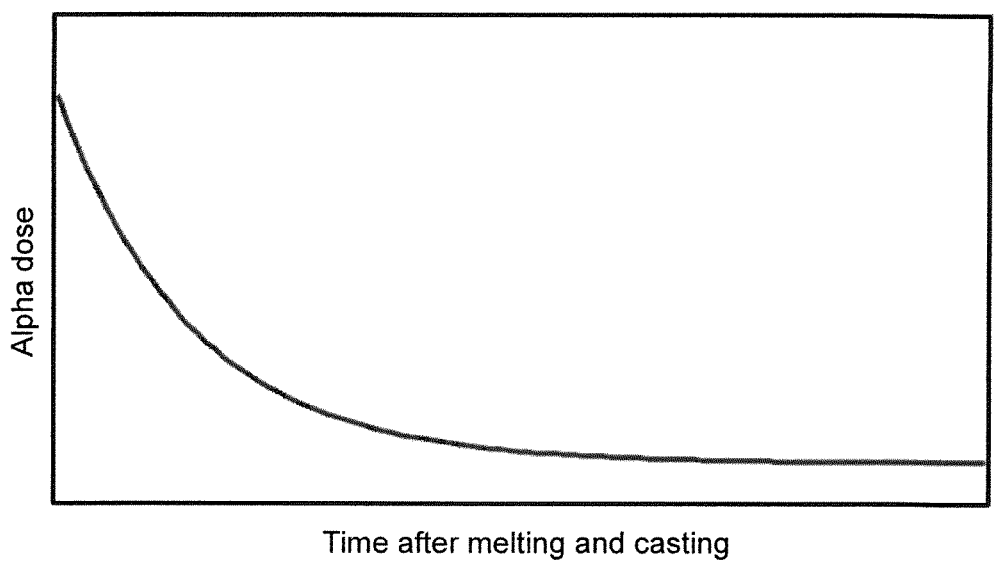

METHOD OF PRODUCING LOW ALPHA-RAY EMITTING BISMUTH, AND LOW ALPHA-RAY EMITTING BISMUTH

BACKGROUND

The present invention relates to a method of producing bismuth with a reduced alpha dose for use in the production of semiconductors, and to a low alpha-ray emitting bismuth obtained with the foregoing method.

Generally speaking, bismuth has a low melting point of 271° C., and is used as a solder material as with lead and tin. Solder is used in: the production of semiconductors for bonding a semiconductor chip and a substrate; or bonding or sealing a Si chip for an IC, an LSI or the like with a lead frame or a ceramic package; or forming bumps during TAB (Tape Automated Bonding) or during production of flip chips, or is used, for example, as a wiring material for use in semiconductors. Moreover, in recent years, development as a thermoelectric material is also being conducted.

Recent semiconductor devices are of high density and with reduced operating voltage and cell volume, and therefore are subject to increased risk of soft errors caused by the effects of alpha rays emitted from materials in the vicinity of semiconductor chips. In particular, there is a strong demand for higher purification of solder materials, and there is a demand for low alpha-ray emitting materials.

While several main lead-free solder materials for use in semiconductors can be considered, tin-indium alloy and tin-bismuth alloy are being considered as a low alpha-ray emitting solder material for use in low temperatures. Nevertheless, since indium is extremely expensive, tin-bismuth alloy is regarded as the most likely prospect.

However, when a tin-bismuth alloy material is selected, it is necessary to reduce the alpha dose of both tin and bismuth. Conventionally, while technologies for reducing the alpha rays emitted from tin and lead have been disclosed, the current situation is that no research is being conducted for reducing the alpha rays emitted from bismuth.

While the present invention aims to provide low alpha-ray emitting bismuth, since the major usage thereof is as a solder material, technologies for reducing the alpha rays emitted from tin as a solder material are introduced below by way of reference.

Patent Document 1 below describes a method of producing low alpha-ray emitting tin by alloying tin and lead having an alpha dose of 10 cph/cm$^2$ or less, and thereafter performing refining in order to eliminate the lead contained in the tin. The object of this technology is to reduce the alpha dose by adding high purity Pb and thereby diluting $^{210}$Pb contained in the tin.

Nevertheless, in the foregoing case, a complicated process of once adding Pb to tin and thereafter eliminating Pb is required. Moreover, while the alpha dose is considerably reduced 3 years after refining tin, this can also be understood to mean that the tin having a low alpha dose cannot be used in less than 3 years from the refinement, and it cannot be said that Patent Document 1 is an industrially efficient method.

Patent Document 2 describes that, by adding 10 to 5000 ppm of a material selected from Na, Sr, K, Cr, Nb, Mn, V, Ta, Si, Zr, and Ba to a Sn—Pb alloy solder material, the count of radiation alpha particles can be reduced to 0.5 cph/cm$^2$ or less.

Nevertheless, even when these materials are added, the reduced count of the radiation alpha particles can only be a 0.015 cph/cm$^2$ level, and this is lower than the level that is expected as a material for use in modern-day semiconductor devices.

An additional problem is that, as the additive materials, used are elements such as alkali metal elements, transition metal elements and heavy metal elements, of which inclusion into semiconductors is undesirable. Accordingly, there is no choice but to say that the material of Patent Document 2 is of a low level as a material for use in the assembly of semiconductor devices.

Patent Document 3 below describes reducing the count of radiation alpha particles emitted from solder extra fine wires to 0.5 cph/cm$^2$ or less so that they can be used as the connecting wires of semiconductor devices. Nevertheless, this kind of count level of radiation alpha particles is lower than the level that is expected as a material for use in modern-day semiconductor devices.

Patent Document 4 below describes obtaining high purity tin having a low lead concentration and in which the alpha ray count of lead is 0.005 cph/cm$^2$ or less by using special grade sulfuric acid or special grade hydrochloric acid (highly refined sulfuric acid or highly refined hydrochloric acid) as the electrolyte, and using high purity tin as the anode to perform electrolysis. If a high purity raw material (reagent) is used without regard to cost, it is obvious that a high purity material can be obtained. Even then, the lowest alpha ray count of the precipitated tin disclosed in the Examples of Patent Document 4 is 0.002 cph/cm$^2$, and is unable to achieve the expected level despite the high cost.

Patent Document 5 below describes a method of obtaining metal tin having a purity of 5N or higher by adding nitric acid to a heated aqueous solution, in which coarse metal tin has been added, to precipitate metastannic acid; obtaining the metastannic acid through filtering and washing; dissolving the washed metastannic acid in hydrochloric acid or hydrofluoric acid; and using the obtained solution as the electrolyte to perform electrowinning. While this technology vaguely describes its application for use in semiconductor devices, no particular reference is made to the limitation of radioactive elements and the radiation alpha particle count, and it could be said that Patent Document 5 has a low level of interest regarding these issues.

Patent Document 6 below describes a technology of reducing the amount of Pb contained in Sn configuring the solder alloy, and using Bi or Sb, Ag, Zn as the alloy material. Nevertheless, in the foregoing case, even if Pb is reduced as much as possible, Patent Document 6 fails to particularly describe a fundamental solution to the problem of the radiation alpha particle count caused by the Pb that inevitably gets mixed in.

Patent Document 7 below discloses tin having a grade of 99.99% or higher and a radiation alpha particle count of 0.03 cph/cm$^2$ or less which is produced by performing electrolysis using a special grade sulfuric acid reagent. In the foregoing case also, if a high purity raw material (reagent) is used without regard to cost, it is obvious that a high purity material can be obtained. Even then, the lowest alpha ray count of the precipitated tin disclosed in the Examples of Patent Document 7 is 0.003 cph/cm$^2$, and is unable to achieve the expected level despite the high cost.

Patent Document 8 below describes lead, as a brazing filler material for use in semiconductor devices, having a grade of 4N or higher, a radioactive isotope of less than 50 ppm, and a radiation alpha particle count of 0.5 cph/cm$^2$ or less. Moreover, Patent Document 9 below describes tin, as a brazing filler material for use in semiconductor devices, having a grade of 99.95% or higher, a radioactive isotope of less than 30 ppm, and a radiation alpha particle count of 0.2 cph/cm$^2$ or less.

Both of the foregoing technologies have a moderate tolerance of the radiation alpha particle count, and there is a problem in that they are unable to achieve the level that is expected as a material for use in modern-day semiconductor devices.

In light of the foregoing circumstances, the present Applicant proposed high purity tin as described in Patent Document 10 below; that is, high purity tin, which has a purity of 5N or higher (excluding gas components of O, C, N, H, S, and P), and in which the contents of U and Th as radioactive elements are each 5 ppb or less, and the contents of Pb and Bi emitting radiation alpha particles are each 1 ppm or less, so as to eliminate, as much as possible, the influence of alpha rays on semiconductor chips.

In the foregoing case, the high purity tin is produced by being ultimately subject to melting and casting, and subject to rolling and cutting as needed, and Patent Document 10 relates to a technology for causing the alpha ray count of high purity tin to be 0.001 cph/cm$^2$ or less.

Upon refining Sn, when it is heated during a production process such as melting or casting, Po becomes sublimed since Po has extremely high sublimability. If it is possible to eliminate the polonium isotope $^{210}$Po at the initial stage of production, disintegration from the polonium isotope $^{210}$Po to the lead isotope $^{206}$Pb can naturally be prevented, and it is considered that the generation of alpha rays can also be avoided.

This is because the generation of alpha rays during the production process is considered to be during the disintegration from the polonium isotope $^{210}$Po to the lead isotope $^{206}$Pb. Nevertheless, in reality, while it was considered that Po had mostly disappeared during production, the generation of alpha rays was still observed. Accordingly, it could not be said that simply reducing the alpha ray count of high purity tin at the initial stage of production would be the fundamental solution to the problem.

In light of the foregoing circumstances, the present inventors developed tin in which the alpha dose of the sample after melting and casting is less than 0.0005 cph/cm$^2$ (see Patent Document 11). This tin can be obtained by leaching raw material tin having a purity level of 3N with hydrochloric acid or sulfuric acid, and thereafter performing electrolytic refining by using an electrolyte having a pH of 1.0 or less and Sn concentration of 200 g/L or less.

This technology is extremely effective, and it was possible to resolve the problems regarding tin, but bismuth still remained a material with a high alpha dose, and the problems regarding bismuth were still unresolved.

Meanwhile, there are the following Patent Documents as technologies related to bismuth.

Patent Document 12 relates to an electrolytic production method of tin sulfate and bismuth sulfate for tin-bismuth alloy plating, and discloses an electrolytic production method of tin sulfate and bismuth sulfate for tin-bismuth alloy plating, characterized in that: tin or bismuth as an anode is subject to melting in a sulfuric acid electrolyte by using an electrolytic bath in which the anode and the cathode are separated with an anion exchange membrane or with an anion exchange membrane and a cation exchange membrane, using a sulfuric acid solution as the electrolyte, and applying a direct voltage to the anode and the cathode; and a film plated with the obtained tin or bismuth salt has the radioactive alpha particle count of less than 0.1 cph/cm$^2$.

Moreover, Patent Document 13 discloses a method of producing high purity bismuth via electrolytic refining by using an electrolyte containing hydrofluosilicic acid. Patent Document 14 describes a method of producing high purity bismuth via vacuum melting and vacuum distillation, and the device therefor. Patent Document 15 discloses a solder bonding method and an electronic device. Patent Document 16 discloses a method of producing Bi-212 via solvent extraction, and the device therefor, as well as the usage thereof.

Furthermore, Patent Document 17 relates to an electrolytic refining method for bismuth, and discloses an electrolytic refining method for bismuth, wherein bismuth metal in which the lead grade is controlled in advance to be 1 mass % or less is used as the anode, a titanium plate is used as the cathode, and hydrochloric acid solution is used as the electrolyte to perform electrolytic refining of bismuth in the hydrochloric acid solution at 10 to 30 g/L and at a current density of 150 A/m$^2$ or less so as to enable electrolysis in a state where the tank voltage is stable, and thereby the refined bismuth in which the lead grade in the cathode electrodeposit is 0.01 mass % or less can be obtained.

Nevertheless, with this electrolytic refining method for bismuth which uses a hydrochloric acid bath, while it is effective in terms of eliminating lead, there is a problem in that the equipment becomes corroded since a bath with a high hydrochloric acid concentration is used.

With regard to Patent Documents 12 to 17 described above, while there are technologies for achieving the high purification of bismuth, the alpha ray count of the highly purified bismuth is of a 0.1 cph/cm$^2$ level, and it was considered that this was the limit of the conventional technologies related to bismuth. Naturally, when a bismuth material obtained from these technologies is used, there is a problem of increased risk of soft errors caused by the effects of alpha rays emitted from materials in the vicinity of semiconductor chips.

Moreover, Patent Document 18 below discloses a technology of eliminating alpha-ray emitting nuclides by decreasing the nitric acid concentration of a commercially available product, in which crystals of bismuth nitrate are dissolved in a nitric acid aqueous solution, to coprecipitate bismuth oxynitrate and alpha-ray emitting nuclides. Nevertheless, since bismuth will also disappear and inferior efficiency will inevitably arise, there is a problem in that the production efficiency will deteriorate.

Moreover, as described in Patent Document 19 below, bismuth is normally refined via the distillation method or electrolysis, but with the distillation method, distillation needs to be repeated many times, and, when there are azeotropic mixtures, it is difficult to isolate and refine bismuth, and lead cannot be reduced to a level of 1 ppm or less. Moreover, the electrolyte, in which hexafluorosilicic acid and acid are mixed, and an additive such as glue is added thereto, is used for electrolysis. The contamination of lead results from the hexafluorosilicic acid and the additive such as glue, and there is a limit in that lead can only be reduced to a several 10 ppm level.

Meanwhile, in an electrolyte of acid (hydrochloric acid or sulfuric acid) which does not use hexafluorosilicic acid or any additive, by controlling the pH, bismuth concentration in the electrolyte, electrolyte temperature, and current density, it is now possible to cause the content of lead to be 1 ppm or less, contents of uranium and thorium to each be 5 ppb or less, and alpha dose to be 0.01 cph/cm$^2$ or less (see Patent Document 19).

Moreover, the present inventors previously provided, as a method which is easier to handle than hydrochloric acid and sulfuric acid and which reduces the damage to the equipment, "a method of producing low alpha-ray emitting bismuth by inserting a titanium cathode and a bismuth anode in a nitric acid solution having a bismuth concentration of 5 to 50 g/L and a pH of 0.0 to 0.4 to perform electrolytic refining at a cathode current density of 0.1 to 1 A/dm$^2$, and additionally subjecting the bismuth obtained from the electrolytic refining to hydrogen reduction melting or vacuum melting"; whereby it is possible to obtain bismuth having an alpha dose of 0.01 cph/cm$^2$ or less from a raw material having an alpha dose of 0.05 cph/cm$^2$.

Nevertheless, the alpha dose emitted from the bismuth obtained from Patent Document 19 and by the refining method using a nitric acid bath is 0.01 cph/cm$^2$ or less; but in the case of using a material in which the alpha dose emitted from the bismuth raw material used in the electrolytic refining is high, it was discovered that an alpha dose that is higher than 0.01 cph/cm$^2$ is generated after electrolytic refining, and it was necessary to make further improvements so that the alpha rays can be easily reduced even when using a raw material having a high alpha dose.

Moreover, it is now known that the alpha ray source in the bismuth raw material is mainly polonium. Polonium is a representative radioactive element that is contained in a bismuth raw material. In order to reduce the alpha dose, it is necessary to reduce polonium, but this point is not described in Patent Document 19.

The present invention provides a method of producing bismuth having a lower alpha dose even from a bismuth raw material having an alpha dose that is even higher than the bismuth raw material used in the foregoing electrolytic refining.

CITATION LIST

Patent Documents

[Patent Document 1] Japanese Patent No. 3528532
[Patent Document 2] Japanese Patent No. 3227851
[Patent Document 3] Japanese Patent No. 2913908
[Patent Document 4] Japanese Patent No. 2754030
[Patent Document 5] JP H11-343590 A
[Patent Document 6] JP H09-260427A
[Patent Document 7] JP H01-283398 A
[Patent Document 8] JP S62-047955 A
[Patent Document 9] JP S62-001478 A
[Patent Document 10] WO 2007-004394
[Patent Document 11] WO 2011-114824
[Patent Document 12] JP H08-246200 A
[Patent Document 13] JP 2000-045087 A
[Patent Document 14] JP H10-158754 A
[Patent Document 15] JP H11-330678A
[Patent Document 16] JP 2000-505097 A
[Patent Document 17] JP 2009-097072 A
[Patent Document 18] JP H09-255339 A
[Patent Document 19] JP 2013-185214 A

SUMMARY

Recent semiconductor devices are of high density and with reduced operating voltage and cell volume, and therefore are subject to increased risk of soft errors caused by the effects of alpha rays emitted from materials in the vicinity of semiconductor chips. In particular, there is a strong demand for higher purification of solder materials used near semiconductor devices, and there is a demand for low alpha-ray emitting materials. The present invention aims to provide a method of producing bismuth, in which the alpha dose can be reduced, and which can be suitably applied to demands as a solder material.

Solution to Problem

In order to achieve the foregoing object, the following invention is provided.
1) Low alpha-ray emitting bismuth, wherein an alpha dose is 0.003 cph/cm$^2$ or less.
2) The low alpha-ray emitting bismuth according to 1) above, wherein a content of Pb is 0.1 ppm or less.
3) The low alpha-ray emitting bismuth according to 1) or 2) above, wherein contents of U and Th are each 5 ppb or less.
4) A low alpha-ray emitting bismuth-tin alloy, wherein the alloy is of the bismuth according to any one of 1) to 3) above, and tin having an alpha dose of less than 0.001 cph/cm$^2$.
5) A low alpha-ray emitting bismuth-tin alloy, wherein the alloy is of the bismuth according to any one of 1) to 3) above, and tin having an alpha dose of less than 0.001 cph/cm$^2$, and the alloy has an alpha dose of 0.0020 cph/cm$^2$ or less.
6) The low alpha-ray emitting bismuth-tin alloy according to 4) or 5) above, wherein a content of tin is 40 mass % or more and 55 mass % or less.
7) A method of producing low alpha-ray emitting bismuth, wherein bismuth having an alpha dose of 0.5 cph/cm$^2$ or less is used as a raw material, the raw material bismuth is melted in a nitric acid solution via electrolysis to prepare a bismuth nitrate solution having a bismuth concentration of 5 to 50 g/L and a pH of 0.0 to 0.4, the bismuth nitrate solution is passed through a column filled with ion-exchange resin to eliminate polonium contained in the solution by an ion-exchange resin, and bismuth is recovered by means of electrowinning from the solution that was passed through the ion-exchange resin.
8) The method of producing low alpha-ray emitting bismuth according to 7) above, wherein volume of the ion-exchange resin is set to be 500 mL or more and 2 L or less when eliminating the polonium contained in the bismuth nitrate solution by the ion-exchange resin.
9) The method of producing low alpha-ray emitting bismuth according to 7) or 8) above, wherein the rate of passing the bismuth nitrate solution through the column filled with the ion-exchange resin is 5 L/h or more and 8 L/h or less when eliminating the polonium contained in the bismuth nitrate solution by the ion-exchange resin.
10) The method of producing low alpha-ray emitting bismuth according to any one of 7) to 9) above, wherein the raw material bismuth is melted in the nitric acid solution via electrolysis to eliminate elements having an electric potential nobler than bismuth.
11) The method of producing low alpha-ray emitting bismuth according to any one of 7) to 10) above, wherein elements having an electric potential baser than bismuth are eliminated via electrowinning.

Advantageous Effects of Invention

Recent semiconductor devices are of high density and with reduced operating voltage and cell volume, and therefore are subject to increased risk of soft errors due to the effects of alpha rays emitted from materials in the vicinity of semiconductor chips. However, the present invention yields a superior effect of being able to provide bismuth and bismuth alloy that can be suitably applied to materials with a low alpha dose in comparison to conventional technologies. It is thereby possible to considerably reduce the occurrence of soft errors in semiconductor devices caused by the effects of alpha rays.

DETAILED DESCRIPTION

FIG. 1 This is a diagram showing the decay chain (uranium/radium decay chain) from the decay of uranium (U) up to $^{206}$Pb.

FIG. 2 This is a diagram showing the transition of the alpha dose based on the lapse of time after the melting and casting of bismuth.

DESCRIPTION OF EMBODIMENTS

While there are numerous radioactive elements that generate alpha rays, most of them practically pose no problem because their half-life is extremely long or extremely short, and the practical problem is the alpha rays that are generated during the disintegration from the polonium isotope $^{210}$Po to the lead isotope $^{206}$Pb in the U decay chain (see FIG. 1).

Bismuth is entirely a radioactive isotope, and there are multiple nuclides that are responsible for the alpha ray emission. Since it is considered that the alpha dose becomes high due to these radioactive isotopes, the isotopes that are responsible for the alpha ray emission must be isolated and eliminated in order to reduce the alpha dose. Thus, it was considered that it is impossible to industrially produce bismuth having a low alpha dose.

Among the isotopes that are responsible for the alpha ray emission, $^{209}$Bi is the only isotope with a long half-life, and since its half-life is extremely long at $1.9 \times 10^{19}$ years, it is practically harmless.

Other than $^{209}$Bi, an isotope having a long half-life that is responsible for the alpha ray emission is $^{210}$Bi, and its half-life is 5 days (see FIG. 1). The half-life of other isotopes $^{211}$Bi, $^{212}$Bi, and $^{214}$Bi that are responsible for the alpha ray emission is each extremely short at 2 minutes, 61 minutes, and 20 minutes, and their daughter nuclides and granddaughter nuclides similarly have an extremely short half-life, and are practically harmless.

As shown in FIG. 1, $^{210}$Bi disintegrates in the manner of $^{210}$Bi→$^{210}$Po→$^{210}$Pb, and alpha rays are emitted when $^{210}$Po disintegrates to $^{206}$Pb. $^{206}$Pb is a stable isotope. Nevertheless, as a result of examining the alpha dose emitted from bismuth, it was discovered that bismuth yields a unique alpha dose change that cannot be found in other metals (see FIG. 2).

Normally, for instance, in the case of tin, the alpha dose is low immediately after melting and casting, and the alpha dose increases pursuant to the lapse of time. Nevertheless, in the case of bismuth, the alpha dose is high immediately after melting and casting, and decreases pursuant to the lapse of time. As a result of examining this phenomena, it was discovered that the radioactive elements in bismuth that are responsible for the alpha ray emission was mainly polonium.

While it was discovered that most of the alpha rays emitted from bismuth is polonium, the alpha dose of bismuth does not fall below a certain level even after a prolonged time which is sufficiently longer than the half-life of $^{210}$Po; that is, a long period of time in which $^{210}$Po hardly becomes decayed any more. This is considered to be because $^{210}$Pb exists in bismuth, and the decay of $^{210}$Pb→$^{210}$Bi→$^{210}$Po→$^{206}$Pb occurs.

In other words, when the lead isotope $^{210}$Pb (a half-life of 22.3 years) is contained in the material, disintegration (FIG. 1) of $^{210}$Pb$^2$→$^{210}$Bi (a half-life of 5 days)→$^{210}$Po (a half-life of 138 days) will advance pursuant to the lapse of time, and the decay chain becomes reconstructed and $^{210}$Po is generated. Thus, alpha rays are generated based on the disintegration from the polonium isotope $^{210}$Po to the lead isotope $^{206}$Pb.

Accordingly, it is also important to reduce the ratio of the lead isotope $^{210}$Pb in bismuth in addition to reducing polonium. By reducing the content of Pb to be 0.1 ppm or less, it is consequently possible to reduce the lead isotope $^{210}$Pb, and the alpha dose of bismuth can thereby be reduced even more.

Upon producing low alpha-ray emitting bismuth, it is desirable to use bismuth having an alpha dose of 0.5 cph/cm$^2$ or less as the raw material. Since the isolation of Po becomes difficult when the alpha dose of the raw material is high, it is preferable to use a raw material having a relatively low alpha dose; that is, an alpha dose of 0.5 cph/cm$^2$ or less. However, it is obvious that the upper limit of the alpha dose of the raw material is not limited since it can be adjusted according to the intended alpha dose reduction.

A bismuth nitrate solution having a bismuth concentration of 5 to 50 g/L and a pH of 0.0 to 0.4 is prepared via electrolysis. The raw material bismuth is melted in a nitric acid solution via the foregoing electrolysis to eliminate elements having an electric potential nobler than bismuth.

The reason why the bismuth concentration is set to be 5 to 50 g/L is because when the bismuth concentration is lower than 5 g/L, the production efficiency will deteriorate, and when the bismuth concentration is greater than 50 g/L, precipitation of the bismuth compound will occur and deteriorate the yield. Moreover, the reason why the pH is set to be 0.0 to 0.4 is because when the pH is lower than 0.0, more chemicals are required, and when the pH is greater than 0.4, the solubility of bismuth will decrease, and it becomes difficult to achieve a sufficient bismuth concentration.

Next, the bismuth nitrate solution is passed through a column that is filled with ion-exchange resin, and polonium (Po) in the solution is eliminated by the ion-exchange resin. Upon performing this elimination by the ion-exchange resin, the volume of the ion-exchange resin is preferably 500 mL or more and 2 L or less. At a low volume that is lower than 500 mL, polonium absorption into the resin will deteriorate, and it is not possible to efficiently eliminate polonium. Moreover, at a high volume that is higher than 2 L, an increase in the amount of resin used causes an increase in the treatment cost, and the amount of bismuth that becomes adsorbed into the resin will increase so that the yield will deteriorate, and therefore it would be inappropriate.

Moreover, the rate of passing the bismuth nitrate solution through the resin column (solution velocity) for the elimination by ion exchange is preferably 5 L/h or more and 8 L/h or less. At a low rate that is less than 5 L/h, treatment time will be longer and the treatment efficiency will deteriorate, and therefore it is undesirable. Meanwhile, when the rate exceeds 8 L/h, the solution velocity is too fast and polonium will pass through the ion-exchange resin without being adsorbed so that polonium-adsorbing efficiency of the resin will deteriorate, and therefore it is undesirable. Bismuth is recovered by means of electrowinning from the solution that was passed through the ion-exchange resin. As a result of performing electrowinning, it is possible to eliminate elements having an electric potential baser than bismuth. It is thereby possible to effectively eliminate Po, and produce bismuth having a low alpha dose.

Accordingly, it is possible to obtain low alpha-ray emitting bismuth having an alpha dose of 0.003 cph/cm² or less. The obtained bismuth can also cause the content of Pb to be 0.1 ppm or less, and the contents of U and Th to each be 5 ppb or less, and the present invention covers all of the above.

Moreover, by mixing and melting the foregoing low alpha-ray emitting bismuth having an alpha dose of 0.003 cph/cm² or less, and tin having an alpha dose of less than 0.001 cph/cm², it is possible to produce a low alpha-ray emitting bismuth-tin alloy having an alpha dose of 0.0020 cph/cm² or less.

Here, while there is no particular limitation in the method of producing the low alpha-ray emitting tin that is used for producing the low alpha-ray emitting bismuth-tin alloy of the present invention, for instance, it is desirable to use low alpha-ray emitting tin having a purity of 5N or higher and an alpha dose of less than 0.001 cph/cm² as described in Japanese Unexamined Patent Application Publication No. 2010-156052 A, which is obtained by leaching commercially available tin having a purity level of 3N in acid such as sulfuric acid to obtain an electrolyte, and performing electrolytic refining while adsorbing impurities contained in the electrolyte with adsorption materials such as oxides, activated carbon and carbon.

EXAMPLES

The Examples and Comparative Examples of the present invention are now explained. Note that the Examples and Comparative Examples are merely exemplifications, and the present invention is not limited to the Examples. In other words, the present invention covers all modes and modifications other than the Examples within the scope of the technical spirit of the present invention. Moreover, the Comparative Examples are outside the conditions of the present invention, but have been prepared for facilitating the understanding of the effects of the present invention.

Example 1

Raw material bismuth having an alpha dose of 0.483 cph/cm² was melted in a nitric acid solution via electrolysis to eliminate elements having an electric potential nobler than bismuth. As the bismuth nitrate solution, 100 L of a solution having a Bi concentration of 40.2 g/L and a pH of 0.3 was used.

The bismuth nitrate solution was passed through, at a rate of 5 L/h, a column filled with 2 L of cation-exchange resin of DIAION SK-1 B manufactured by Mitsubishi Chemical Corporation, which is one type of strongly acidic cation-exchange resin and has a sulfonate group (—SO3H) as the exchange group.

Subsequently, electrowinning was performed at 25 A and 0.48 A/cm² using the aforementioned solution (filtrate) 1, which was passed through the cation-exchange resin, to eliminate elements having an electric potential baser than bismuth and obtain metal bismuth.

The alpha dose of the obtained metal bismuth was thereafter measured using an alpha ray measurement device. The alpha dose of the raw material bismuth and the alpha dose of the refined bismuth are shown in Table 1.

As shown in Table 1, while the surface alpha dose of the raw material was 0.483 cph/cm², the alpha dose after refinement was 0.003 cph/cm², and the reduction of the alpha dose was notable. Moreover, as a result of analyzing the obtained bismuth using a GDMS (glow discharge mass spectrometric analysis method), the content of Pb was 0.1 ppm or less.

TABLE 1

| | Surface alpha dose (cph/cm²) |
|---|---|
| Raw material | 0.483 |
| After refining | 0.003 |

Example 2

Raw material bismuth having an alpha dose of 0.462 cph/cm² was melted in a nitric acid solution via electrolysis to eliminate elements having an electric potential nobler than bismuth. As the bismuth nitrate solution, 100 L of a solution having a Bi concentration of 41.6 g/L and a pH of 0.3 was used.

The bismuth nitrate solution was passed through, at a rate of 8 L/h, a column filled with 500 mL of cation-exchange resin of DIAION SK-1 B manufactured by Mitsubishi Chemical Corporation.

Subsequently, electrowinning was performed at 50 A and 0.97 A/cm² using the aforementioned filtrate 2 to eliminate elements having an electric potential baser than bismuth and obtain metal bismuth.

The alpha dose of the obtained metal bismuth was thereafter measured using an alpha ray measurement device. The alpha dose of the raw material bismuth and the alpha dose of the refined bismuth are shown in Table 2.

As shown in Table 2, while the surface alpha dose of the raw material was 0.462 cph/cm², the alpha dose after refinement was 0.003 cph/cm², and the reduction of the alpha dose was notable.

Moreover, as a result of analyzing the obtained bismuth using a GDMS (glow discharge mass spectrometric analysis method), the content of Pb was 0.1 ppm or less.

TABLE 2

| | Surface alpha dose (cph/cm²) |
|---|---|
| Raw material | 0.462 |
| After refining | 0.003 |

Comparative Example 1

Raw material bismuth having an alpha dose of 0.710 cph/cm² was melted in a nitric acid solution via electrolysis to eliminate elements having an electric potential nobler than bismuth. As the bismuth nitrate solution, 100 L of a solution having a Bi concentration of 40.3 g/L and a pH of 0.3 was used.

The bismuth nitrate solution was passed through, at a rate of 10 L/h, a column filled with 400 mL of cation-exchange resin of DIAION SK-1 B manufactured by Mitsubishi Chemical Corporation.

Subsequently, electrowinning was performed at 50 A and 0.97 A/cm² using the aforementioned filtrate 3 to eliminate elements having an electric potential baser than bismuth and obtain metal bismuth.

The alpha dose of the obtained metal bismuth was thereafter measured using an alpha ray measurement device. The alpha dose of the raw material bismuth and the alpha dose of the refined bismuth are shown in Table 3.

As shown in Table 3, while the surface alpha dose of the raw material was 0.710 cph/cm$^2$, the alpha dose after refinement was 0.005 cph/cm$^2$, and the alpha dose decreased, but was insufficient.

TABLE 3

|  | Surface alpha dose (cph/cm$^2$) |
|---|---|
| Raw material | 0.710 |
| After refining | 0.005 |

Comparative Example 2

Raw material bismuth having an alpha dose of 0.510 cph/cm$^2$ was melted in a nitric acid solution via electrolysis to eliminate elements having an electric potential nobler than bismuth. As the bismuth nitrate solution, 100 L of a solution having a Bi concentration of 40.5 g/L and a pH of 0.2 was used.

The bismuth nitrate solution was passed through, at a rate of 9 L/h, a column filled with 450 mL of cation-exchange resin of DIAION SK-1B manufactured by Mitsubishi Chemical Corporation.

Subsequently, electrowinning was performed at 50 A and 0.97 A/cm$^2$ using the aforementioned filtrate 4 to eliminate elements having an electric potential baser than bismuth and obtain metal bismuth.

The alpha dose of the obtained metal bismuth was thereafter measured using an alpha ray measurement device. The alpha dose of the raw material bismuth and the alpha dose of the refined bismuth are shown in Table 4.

As shown in Table 4, while the surface alpha dose of the raw material was 0.510 cph/cm$^2$, the alpha dose after refinement was 0.004 cph/cm$^2$, and the alpha dose decreased, but was insufficient.

TABLE 4

|  | Surface alpha dose (cph/cm$^2$) |
|---|---|
| Raw material | 0.510 |
| After refining | 0.004 |

Example 3

2 kg of low alpha-ray emitting bismuth having an alpha dose of 0.003 cph/cm$^2$ which was refined with the method described in Example 1, and 2 kg of tin having an alpha dose of 0.0008 cph/cm$^2$ were filled in a graphite crucible, and the bismuth and tin were alloyed by being mixed and melted at 300° C.

The alpha dose of the bismuth-tin alloy that was alloyed in Example 3 was 0.0018 cph/cm$^2$, and a bismuth-tin alloy having a low alpha dose was obtained.

It has been confirmed that, as a material for use in semiconductor chips which are recently of high density and with reduced operating voltage and cell volume, the bismuth-tin alloy having a low alpha dose produced as described above is effective in reducing the occurrence of soft errors caused by alpha rays, and the alpha dose has been reduced to a favorable level as a semiconductor material.

TABLE 5

|  | Surface alpha dose (cph/cm$^2$) |
|---|---|
| Refined Bi raw material | 0.003 |
| Refined Sn raw material | 0.0008 |
| Bi—Sn alloy | 0.0018 |

Comparative Example 3

2 kg of bismuth having an alpha dose of 0.005 cph/cm$^2$ which was refined with the method described in Comparative Example 1, and 2 kg of tin having an alpha dose of 0.002 cph/cm$^2$ were used, and the bismuth and tin were alloyed with the same method as the method described in Example 3.

The alpha dose of the bismuth-tin alloy that was alloyed in Comparative Example 3 was 0.004 cph/cm$^2$, and it was not possible to obtain a bismuth-tin alloy having a low alpha dose that is sufficiently usable, as a material for use in semiconductor chips which are recently of high density and with reduced operating voltage and cell volume, for reducing the occurrence of soft errors caused by alpha rays.

TABLE 6

|  | Surface alpha dose (cph/cm$^2$) |
|---|---|
| Refined Bi raw material | 0.005 |
| Refined Sn raw material | 0.0020 |
| Bi—Sn alloy | 0.0040 |

INDUSTRIAL APPLICABILITY

As described above, the present invention can provide bismuth that is suitable for low alpha-ray emitting materials. Recent semiconductor devices are of high density and with reduced operating voltage and cell volume, and therefore are subject to increased risk of soft errors caused by the effects of alpha rays emitted from materials in the vicinity of semiconductor chips. However, by using low alpha-ray emitting bismuth, it is possible to yield an effect of reducing the occurrence of soft errors in semiconductor devices caused by the effects of alpha rays. In particular, bismuth as a low alpha-ray emitting material can be suitably used as the raw material of bismuth-tin for solder materials and the like.

The invention claimed is:

1. A low alpha-ray dose bismuth, wherein the bismuth has an alpha-ray dose of 0.003 cph/cm$^2$ or less.

2. The low alpha-ray dose bismuth according to claim 1, wherein the bismuth has a content of Pb of 0.1 ppm or less.

3. The low alpha-ray dose bismuth according to claim 2, wherein the bismuth has a content of each of U and Th of 5 ppb or less.

4. A low alpha-ray dose bismuth-tin alloy, wherein the alloy comprises bismuth according to claim 3 and tin having an alpha-ray dose of less than 0.001 cph/cm$^2$.

5. A low alpha-ray dose bismuth-tin alloy according to claim 4, wherein the alloy has an alpha-ray dose of 0.0020 cph/cm$^2$ or less.

6. The low alpha-ray dose bismuth-tin alloy according to claim 5, wherein the alloy has a content of tin of 40 mass % or more and 55 mass % or less.

7. The low alpha-ray dose bismuth according to claim 3, wherein the bismuth has an alpha-ray dose of 0.003 cph/cm$^2$.

8. A low alpha-ray dose bismuth-tin alloy, wherein the alloy comprises bismuth according to claim 2 and tin having an alpha-ray dose of less than 0.001 cph/cm$^2$.

9. A low alpha-ray dose bismuth-tin alloy according to claim 8, wherein the alloy has an alpha-ray dose of 0.0020 cph/cm$^2$ or less.

10. The low alpha-ray dose bismuth-tin alloy according to claim 8, wherein the alloy has a content of tin of 40 mass % or more and 55 mass % or less.

11. The low alpha-ray dose bismuth according to claim 1, wherein the bismuth has a content of each of U and Th of 5 ppb or less.

12. A low alpha-ray dose bismuth-tin alloy, comprising bismuth according to claim 1 and tin having an alpha-ray dose of less than 0.001 cph/cm$^2$ such that the alloy has an alpha-ray dose of 0.0020 cph/cm$^2$ or less.

13. The low alpha-ray dose bismuth-tin alloy according to claim 12, wherein the alloy has a content of tin of 40 mass % or more and 55 mass % or less.

14. The low alpha-ray dose bismuth-tin alloy according to claim 13, wherein the alloy has an alpha-ray dose of 0.0018 cph/cm$^2$.

15. A method of producing low alpha-ray dose bismuth having an alpha-ray dose of 0.003 cph/cm$^2$ or less, wherein bismuth having an alpha-ray dose of 0.5 cph/cm$^2$ or less is used as a raw material, the raw material bismuth is melted in a nitric acid solution via electrolysis to prepare a bismuth nitrate solution having a bismuth concentration of 5 to 50 g/L and a pH of 0.0 to 0.4, the bismuth nitrate solution is passed through a column filled with ion-exchange resin to eliminate polonium contained in the solution by an ion-exchange resin, and bismuth is recovered by means of electrowinning from the solution that was passed through the ion-exchange resin.

16. The method of producing low alpha-ray dose bismuth according to claim 15, wherein volume of the ion-exchange resin is set to be 500 ml or more and 2 L or less when eliminating the polonium contained in the bismuth nitrate solution by the ion-exchange resin.

17. The method of producing low alpha-ray dose bismuth according to claim 16, wherein the rate of passing the bismuth nitrate solution through the column filled with the ion-exchange resin is 5 L/h or more and 8 L/h or less when eliminating the polonium contained in the bismuth nitrate solution by the ion-exchange resin.

18. The method of producing low alpha-ray dose bismuth according to claim 17, wherein the raw material bismuth is melted in the nitric acid solution via electrolysis to eliminate elements having an electric potential nobler than bismuth.

19. The method of producing low alpha-ray dose bismuth according to claim 18, wherein elements having an electric potential baser than bismuth are eliminated via electrowinning.

20. The method of producing low alpha-ray dose bismuth according to claim 15, wherein the rate of passing the bismuth nitrate solution through the column filled with the ion-exchange resin is 5 L/h or more and 8 L/h or less when eliminating the polonium contained in the bismuth nitrate solution by the ion-exchange resin.

21. The method of producing low alpha-ray dose bismuth according to claim 15, wherein the raw material bismuth is melted in the nitric acid solution via electrolysis to eliminate elements having an electric potential nobler than bismuth.

22. The method of producing low alpha-ray dose bismuth according to claim 15, wherein elements having an electric potential baser than bismuth are eliminated via electrowinning.

* * * * *